(12) United States Patent
Wei et al.

(10) Patent No.: US 12,254,954 B2
(45) Date of Patent: Mar. 18, 2025

(54) ON-DIE TERMINATION CONFIGURATION FOR INTEGRATED CIRCUIT

(71) Applicant: YANGTZE MEMORY TECHNOLOGIES CO., LTD., Wuhan (CN)

(72) Inventors: Debo Wei, Wuhan (CN); Huangpeng Zhang, Wuhan (CN); Jinze Song, Wuhan (CN); Xiaodong Mei, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 203 days.

(21) Appl. No.: 17/993,653

(22) Filed: Nov. 23, 2022

(65) Prior Publication Data

US 2024/0144982 A1    May 2, 2024

Related U.S. Application Data

(63) Continuation of application No. PCT/CN2022/129128, filed on Nov. 2, 2022.

(51) Int. Cl.
*G11C 7/10*   (2006.01)
*G11C 29/02*  (2006.01)
*H03K 19/00*  (2006.01)

(52) U.S. Cl.
CPC .......... *G11C 7/1057* (2013.01); *G11C 7/1078* (2013.01); *H03K 19/0005* (2013.01); *G11C 2207/105* (2013.01)

(58) Field of Classification Search
CPC ..... G11C 7/1057; G11C 7/1078; G11C 7/084; G11C 2207/105; G11C 5/063;
(Continued)

(56) References Cited

U.S. PATENT DOCUMENTS

2021/0224155 A1*  7/2021  Bains .................. G06F 11/1048

FOREIGN PATENT DOCUMENTS

CN    106504782 A    3/2017
CN    107533509 A    1/2018
(Continued)

OTHER PUBLICATIONS

International Search Report issued in corresponding International Application No. PCT/CN2022/129128 mailed Jul. 4, 2023, 3 pages.

*Primary Examiner* — Sultana Begum
(74) *Attorney, Agent, or Firm* — BAYES PLLC (57) ABSTRACT

A method of configuring an on-die termination circuit in each non-volatile memory die of a plurality of non-volatile memory dice that have one or more pads coupled in common, includes determining, by each of the non-volatile memory dice whether that non-volatile memory die is a target or a non-target for a memory operation; setting, by each of the non-volatile memory die that determines it is a target, a first on-die termination configuration value; setting, by each of the non-volatile memory die that determines it is a non-target, a second on-die termination configuration value; configuring, by each of the target non-volatile memory die, its corresponding on-die termination circuit to provide a first impedance based, at least in part, on the first on-die termination configuration value; and concurrently with the configuring by each target non-volatile memory die, configuring, by each non-target non-volatile memory die, its corresponding on-die termination circuit to provide a second impedance based, at least in part, on the second on-die termination configuration value.

20 Claims, 10 Drawing Sheets

(58) Field of Classification Search
CPC ... G11C 29/025; G11C 29/028; G11C 13/004; G11C 13/0069; G11C 16/10; G11C 16/26; H03K 19/0005
See application file for complete search history.

(56) References Cited

FOREIGN PATENT DOCUMENTS

| | | |
|---|---|---|
| CN | 110390980 A | 10/2019 |
| CN | 111199758 A | 5/2020 |
| WO | 2022066178 A1 | 3/2022 |

\* cited by examiner

ON-DIE TERMINATION CONFIGURATION FOR INTEGRATED CIRCUIT

CROSS-REFERENCE TO RELATED APPLICATIONS

This application is a continuation of Internal Application No. PCT/CN2022/129128, filed Nov. 2, 2022, entitled "ON-DIE TERMINATION CONFIGURATION FOR INTEGRATED CIRCUIT," which is incorporated herein by reference in its entirety.

BACKGROUND

The present disclosure relates to on-die termination (ODT) for integrated circuits.

Advances in semiconductor manufacturing technologies, together with advances in computer-aided design tools, have led to the design and production of integrated circuits and electronic systems having correspondingly large increases in their functionality, and operating frequency. In turn, high speed data transfer operations are required in memory systems or subsystems to support the operation of the integrated circuits and electronic systems. These high-speed data transfer operations make signal integrity an increasingly important consideration in the design of electronic products.

One aspect of signal integrity engineering involves reducing signal reflections caused by impedance discontinuities, i.e., impedance mismatches, particularly for high frequency operation of electronic products.

SUMMARY

Various implementations of the present disclosure improve signal integrity in non-volatile memory systems, or subsystems, that have two or more non-volatile memory dice coupled in common to a data channel. Such implementations enable both a target and non-target non-volatile memory die to concurrently participate in terminating the data channel, wherein the target die and the non-target die each provide a different termination resistance.

According to one aspect of the present disclosure, a method of configuring an on-die termination circuit in each memory die of a plurality of memory dice in a memory system including a plurality of memory dice that have one or more pads coupled in common, includes determining, by each memory die of the plurality of memory dice, whether that memory die is a target or a non-target for an operation, setting, by each memory die of the plurality of memory dice that determines it is a target, a first on-die termination configuration value, setting, by each memory die of the plurality of memory dice that determines it is a non-target, a second on-die termination configuration value, configuring, by each target memory die, its corresponding on-die termination circuit to provide a first impedance based, at least in part, on the first on-die termination configuration value, and concurrently with the configuring by each target memory die, configuring, by each non-target memory die, its corresponding on-die termination circuit to provide a second impedance based, at least in part, on the second on-die termination configuration value. In some implementations the memory dice are non-volatile memory dice.

In some implementations of the illustrative method, determining includes receiving one or more signals from a memory controller, such as but not limited to, a non-volatile memory controller.

In some implementations of the illustrative method, the plurality of memory dice include flash memory dice.

In some implementations of the illustrative method, the plurality of memory dice include phase-change memory dice.

In some implementations of the illustrative method, the plurality of memory dice include dice having both flash memory cells and phase-change memory cells thereon.

In some implementations of the illustrative method, the first impedance and the second impedance are compatible with a non-volatile double date rate 3 (NV-DDR3) specification.

In some implementations of the illustrative method, the first impedance and the second impedance are different from each other.

According to another aspect of the present disclosure, a memory device, includes an on-die termination circuit configured to provide one of a plurality of termination impedances responsive to an on-die termination configuration value, wherein the on-die termination configuration value is based, at least in part, on whether the memory device is one of a target and a non-target. In some implementations, the memory device is a non-volatile memory device.

Some implementations of the illustrative memory device further include a first on-die termination configuration value stored in a first memory area, and a second on-die termination configuration value stored in a second memory area.

In some implementations of the illustrative memory device, the first memory area is non-volatile, and the second memory area is non-volatile.

In some implementations of the illustrative memory device, the first memory area is a first register, and the second memory area is a second register.

In some implementations of the illustrative memory device, the on-die termination circuit is configured to provide a first termination impedance configuration responsive, at least in part, to the memory device being a target, and the on-die termination circuit is configured to provide a second termination impedance configuration responsive, at least in part, to the memory device being a non-target, wherein the first termination impedance configuration and the second termination impedance configuration are different from each other. In some implementations, the memory device may be a non-volatile memory device.

In some implementations of the illustrative memory device, the memory device is a flash memory device.

In some implementations of the illustrative non-volatile memory device, the memory device is a phase-change memory device.

According to a further aspect of the present disclosure, a system includes a first memory die having a first input/output (I/O) pad coupled to a first on-die termination (ODT) circuit disposed on the first memory die, a second memory die having a second I/O pad coupled to a second ODT circuit disposed on the second memory die, wherein the first I/O pad and the second I/O pad are coupled to each other, a memory controller die having a third I/O pad, the third I/O pad coupled to the first I/O pad and the second I/O pad, a first ODT configuration circuit disposed on the first memory die, the first ODT configuration circuit configured to set the first ODT circuit to provide a first impedance value responsive to the first I/O pad being a target of an operation, and to set the first ODT circuit to a second impedance value responsive to the first I/O pad being a non-target of the operation, and a second ODT configuration circuit disposed on the second memory die, the second ODT configuration circuit configured to set the second ODT circuit to provide the first impedance value responsive to the second I/O pad being the target of the operation, and to set the second ODT circuit to the second impedance value responsive to the second I/O pad being a non-target of the operation. In some implementations the first memory die and the second memory die are each non-volatile memory die.

In some implementations of the illustrative system, the first impedance value and the second impedance value are different from each other.

In some implementations of the illustrative system, the first ODT configuration circuit is further configured to set the first ODT circuit to provide the first impedance value or the second impedance value responsive to an ODT configuration data stored on the first memory die.

In some implementations of the illustrative system, the second ODT configuration circuit is further configured to set the second ODT circuit to provide the first impedance value or the second impedance value responsive to the ODT configuration data stored on the second memory die.

In some implementations of the illustrative system, the first memory die and the second memory die each includes a flash memory.

In some implementations of the illustrative system, the first memory die and the second memory die each includes a phase-change memory.

These illustrative implementations are mentioned not to limit or define the present disclosure, but to provide examples to aid understanding thereof. Additional implementations are discussed in the Detailed Description, and further description is provided there.

BRIEF DESCRIPTION OF THE DRAWINGS

The accompanying drawings, which are incorporated herein and form a part of the specification, illustrate implementations of the present disclosure and, together with the description, further serve to explain the principles of the present disclosure and to enable a person skilled in the pertinent art to make and use the present disclosure.

The present disclosure will be described with reference to the accompanying drawings.

DETAILED DESCRIPTION

Electrically conductive lines are used to connect various pins (or pads) of memory devices to other circuits in an electronic product. These electrically conductive lines tend to behave as transmission lines during high frequency data transfer operations in digital systems. In such digital systems, in which an input pin or pad of an integrated circuit represents an impedance load that does not match the impedance of the transmission line connected to it, a portion of the energy of an incoming signal is reflected back resulting in "noise" that adversely affects signal quality. In other words, the impedance mismatch between the input impedance and transmission line impedance produces an impedance "discontinuity" that causes signal reflections which in turn degrade the incoming signal.

Terminating these lines may reduce the impedance mismatch between the input and the transmission line. Since signal reflections degrade signal integrity, and thereby limit the performance of various electronic products, it is desirable to reduce the signal reflections. Terminating these lines, thus reducing signal reflections, may be referred to herein as line termination. Line termination may be implemented by, for example, introducing a resistive load at, or near, the destination end of a signal line. In some implementations, according to the present disclosure, the aforementioned resistive loads may be on a die rather than external to the die, and may be referred to as on-die termination.

Although specific configurations and arrangements are discussed, it should be understood that this is done for illustrative purposes only. A person skilled in the pertinent art and having the benefit of the present disclosure will recognize that other configurations and arrangements can be used without departing from the spirit and scope of the present disclosure. It will be apparent to a person skilled in the pertinent art that the present disclosure can also be employed in a variety of other applications that benefit from the acceleration of digital data transfers.

It is noted that references in the specification to "one implementation," "an implementation," "an example implementation," "an illustrative implementation," "some implementations," "certain implementations," etc., indicate that the implementation described may include a particular feature, structure, or characteristic, but every implementation may not necessarily include the particular feature, structure, or characteristic. Moreover, such phrases do not necessarily refer to the same implementation. Further, when a particular feature, structure, or characteristic is described in connection with an implementation, it would be within the knowledge of a person skilled in the pertinent art to effect such feature, structure, or characteristic in connection with other implementations whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense.

Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for the existence of additional factors not necessarily expressly described, again, depending at least in part on context.

Aspects of the present disclosure will now be described with reference to various apparatus and methods. These apparatus and methods will be described in the following detailed description and illustrated in the accompanying drawings by various blocks, modules, units, components, circuits, steps, operations, processes, algorithms, etc. (collectively referred to as "elements"). These elements may be implemented using electronic hardware, firmware, computer software, or any combination thereof. Whether such elements are implemented as hardware, firmware, or software depends upon the particular application, and the design and cost constraints imposed on the overall system.

Various terms, expressions, and acronyms are used throughout the present disclosure. For convenience, those various terms, expressions, and acronyms commonly used herein are listed below, and in some instances further include explanations.

Chip, die, and integrated circuit are closely related terms, and their usage is context sensitive. As used herein, integrated circuit refers to active and/or passive circuit elements fabricated together on a die. Dice, as used herein, is the plural form of die. As used herein, die refers to a single integrated circuit. When used alone, the term "die" may refer to a single integrated circuit regardless of whether the die is part of a wafer or has been separated from the wafer. A die that is separated from a wafer may be referred to herein as a singulated die, and a die that is not separated from a wafer may be referred to herein and an unsingulated die.

An input/out pad is referred to herein as an I/O pad. And, as used herein, I/O pad refers to a connection point, or terminal within an integrated circuit through which bidirectional signaling with external components may be performed. Thus, an I/O pad is internally coupled to, at least, an output buffer for driving signals off the die of the I/O pad, and an input circuit for receiving incoming signals from an external transmission line.

As used herein, signal integrity is a general expression relating to performance-degrading problems such as, but not limited to, delays, noise, reflections, ringing, crosstalk, electromagnetic interference (EMI), and the like.

Impedance discontinuity refers to a point in a signal path where there is a change in characteristic impedance.

Transmission lines, which are often used in radio frequency (RF) applications, may be specially constructed to have a nominally uniform characteristic impedance. And, it is known that typical wires, interconnects, or traces on a printed circuit board (PCB), for example, can act like transmission lines when the switching speeds of digital signals on those wires, interconnects, or PCB traces, become very high. But when a transmission line, or a wire, interconnect, or PCB trace behaving as a transmission line, meets an impedance discontinuity, the signals thereon may suffer from signal reflections at the point of impedance discontinuity.

In some electronic product designs, signal reflections may result in errors or failures. These errors or failures may be reduced or eliminated by addressing the impedance discontinuity through the use of termination circuitry. In many instances, termination includes providing a termination resistor at the source, or destination, or source and destination of the signal on the conductor that is behaving as a transmission line.

Although the use of termination resistors may be very helpful in reducing the problems caused by signal reflections, the placement of such resistors consumes area on the printed circuit board, or similar substrate, of electronic systems or subsystems. One approach to saving area on the PCB or other substrate is to move the burden of providing termination resistors onto the integrated circuits, i.e., the die, that are used to build the electronic products. This architectural approach is referred to as on-die termination (ODT).

As used herein, On-Die Termination (ODT) refers to a process of providing a termination resistance to an electrical path to improve signal integrity, typically by reducing signal reflections through a reduction in an impedance mismatch between the electrical path acting as a transmission line, and the input impedance of the load to which the transmission line is connected.

As used herein, motherboard termination refers to an electrical component or circuit disposed on a motherboard. More generally, this can be thought of as applying to any PCB or similar substrate upon or within which termination resistors are placed.

As used herein, On-Die Termination circuit (ODT circuit) refers to the circuitry used to implement the impedance mismatch reduction function of the ODT process. Many ODT circuit configurations are possible, and a number of different ODT circuit configurations have been used commercially. ODT circuits are typically configured to terminate a transmission line by modifying the input impedance "seen" by the transmission line to which the pad is coupled. ODT circuits are integrated on the same die as the pad, and are therefore referred to as on-die termination circuits.

SSD refers to a solid-state drive. An SSD is a data storage having no moving parts. This distinguishes an SSD from storage devices such as, for example, hard disk drives, compact disc drives, and digital video disc drives. SSDs commonly use non-volatile memory devices such as, but not limited to, flash memory devices.

Figure 1:
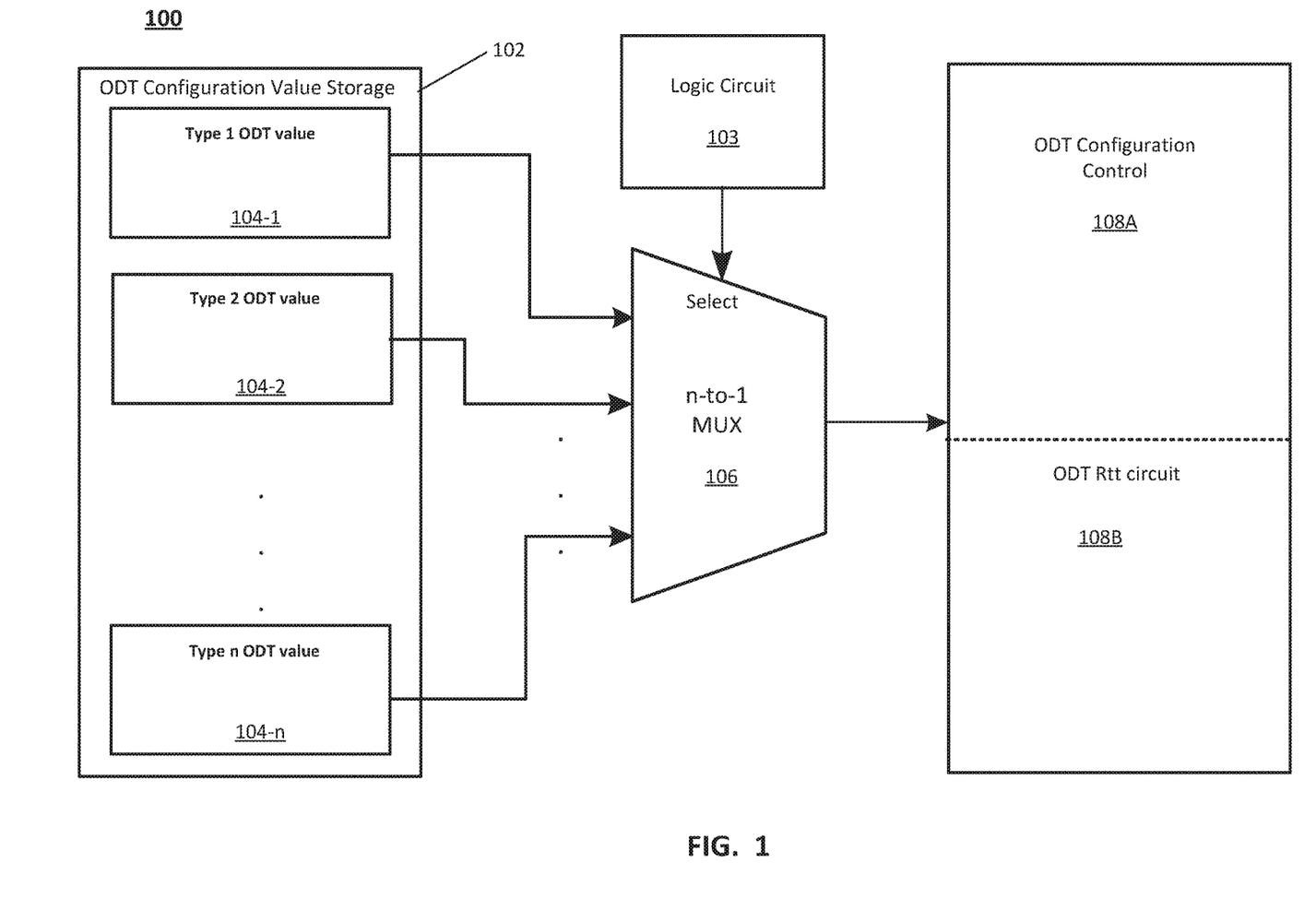
FIG. 1 is a high-level block diagram of one approach to providing an ODT value to an ODT configuration circuit.

FIG. 1 is a high-level block diagram of one approach to providing an ODT configuration value to an ODT configuration circuit. Generally, an ODT Rtt circuit block may provide one of several possible termination resistances (Rtt). The termination resistance provided by the ODT Rtt circuit block may be determined by enabling and disabling various pathways within the ODT Rtt circuit block, so as to "program" or "configure" the ODT Rtt circuit block to effectively provide the desired termination resistance.

Referring to FIG. 1, a functional architecture 100 for determining the desired magnitude of, and providing, a termination resistance includes an ODT configuration value provider circuit 102, which can provide ODT configuration values 104-1, 104-2, . . . 104-$n$, where n is a positive integer. In functional architecture 100, a logic block 103 is configured to provide a select signal to an n-to-1 multiplexer 106. ODT configuration values 104-1, 104-2, . . . 104-$n$ are coupled to corresponding input terminals of n-to-1 multiplexer 106, which outputs one of the n ODT configuration values 104-1, 104-2, . . . 104-$n$. The output of n-to-1 multiplexer 106 is coupled to ODT configuration control logic 108A. ODT configuration control logic 108A is coupled to ODT Rtt circuit block 108B. ODT configuration control logic 108A generates and provides control signals to ODT Rtt circuit block 108B, based on the selected ODT configuration value received from n-to-1 multiplexer 106. ODT Rtt circuit block 108B, responsive to the control signals it receives from ODT configuration control logic 108A, is configured to provide the desired termination resistance.

As noted above, FIG. 1 illustrates a functional architecture for configuring an ODT Rtt circuit block 108B. That is, there are many circuit options for implementing the various logical operations of functional architecture 100. For example, ODT configuration value provider circuit 102 may store ODT configuration values 104-1, 104-2, . . . 104-n, in a non-volatile memory such as, but not limited to, a flash memory, which may be factory programmed, or programmed by a flash memory controller during an initialization operation. Alternatively, ODT configuration values 104-1, 104-2, . . . 104-n, may be hardwired. In a further alternative, ODT configuration values 104-1, 104-2, . . . 104-n, may be stored in a volatile memory such as, but not limited to, a static random-access memory (SRAM), a dynamic random-access memory (DRAM), or the bits of a register (either static or dynamic). Such volatile memories may be written to during an initialization procedure, or similar update operation. In a further example, the functional architecture of selecting 1 of n possible ODT configuration values 104-1, 104-2, . . . 104-n, is illustrated with n-to-1 multiplexer 106. However, in implementations that use addressable memories (regardless of whether these addressable memories are volatile or non-volatile) to store ODT configuration values 104-1, 104-2, . . . 104-n, a multiplexer is not needed and the output of logic block 103 can be used as at least a portion of the memory address to access the stored ODT configuration values.

Figure 2:
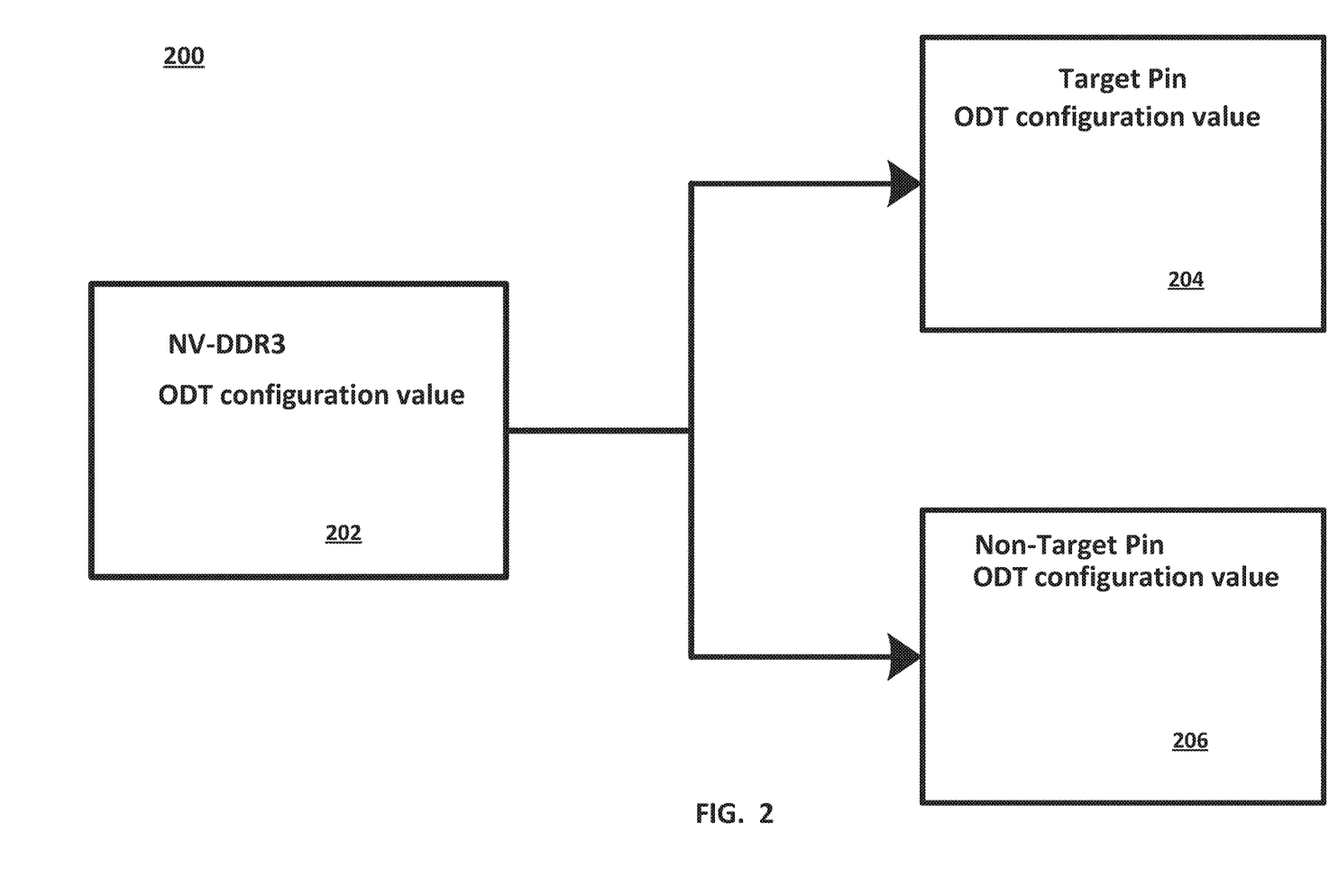
FIG. 2 is a high-level block diagram illustrating the logical architecture of an ODT arrangement compatible with an NV-DDR3 architecture of the Open NAND FLASH Interface (ONFI) specification.

FIG. 2 is a high-level block diagram illustrating a logical architecture 200 of an ODT arrangement compatible with an NV-DDR3 architecture of the Open NAND FLASH Interface (ONFI) specification. FIG. 2 highlights a feature of the NV-DDR3 architecture of the Open NAND FLASH Interface (ONFI) specification that takes note of the fact that in a memory system or a memory subsystem, some non-volatile memory dice are non-targets and some non-volatile memory dice are targets for a given memory transaction; and sets the ODT termination resistance to be the same nominal value for both targets and non-targets.

Still referring to FIG. 2, logical architecture 200 provides a single ODT configuration value in block 202. Block 202 of logical architecture 200 may provide a digital signal of one or more bits to the ODT configuration control logic for setting the desired termination resistance. As indicated in FIG. 2, regardless of whether the ODT circuitry on a non-volatile memory die is intended to operate as a target (block 204) or as a non-target (block 206) in a particular memory transaction, the same ODT configuration value is used. Because the actual input load characteristics between a target and non-target may be different, data transfer rates between the non-volatile memory dice and their controller in a non-volatile memory system or subsystem, may be suboptimal. This is unlike various implementations in accordance with the present disclosure that provide ODT configuration values to targets and non-targets that may be individually set to accommodate different input load conditions at different dice within the non-volatile memory system, or subsystem.

Figure 3A:
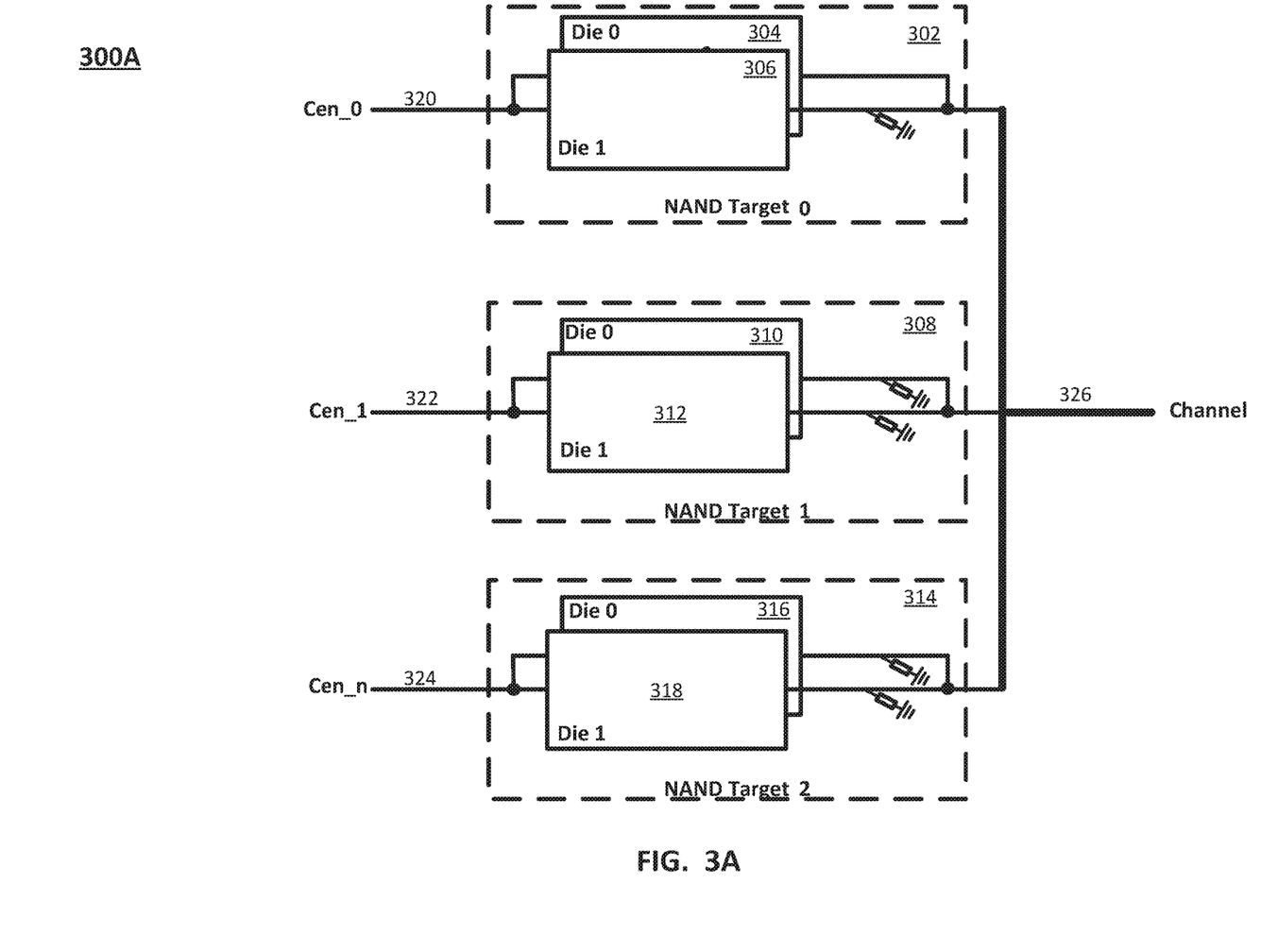
FIG. 3A is a high-level schematic diagram showing an arrangement of NAND flash memory dice having an ODT capability, the arrangement having a common data channel.

FIG. 3A is a high-level schematic diagram showing an arrangement 300 of NAND flash memory dice having an ODT capability, arrangement 300 having a common data channel. Arrangement 300 includes a first package 302 of flash memory dice 304, 306, a second package 308 of flash memory dice 310, 312, and a third package 314 of flash memory dice 316, 318. Flash memory dice 304, 306 have their data pads coupled together, and have their chip-enable pads coupled together. Flash memory dice 310, 312 have their data pads coupled together, and have their chip-enable pads coupled together. Flash memory dice 316, 318 have their data pads coupled together, and have their chip-enable pads coupled together. First package 302 is coupled to a first chip-enable signal 320; second package 308 is coupled to a second chip-enable signal 322; and third package 314 is coupled to a third chip-enable signal 324. Flash memory dice 304, 306, 310, 312, 316, and 318 are all coupled to data channel 326.

Still referring to FIG. 3A, in the case where flash memory die 304 in first package 302 is a target for a memory operation, and all the other flash memory dice 306, 310, 312, 316, 318, are not a target, and the load on the target and non-target pads are not all the same, then better signal integrity, and thus better performance, may be obtained by having the ability to individually configure the termination resistance on the different dice. That is, rather than having a single ODT configuration value, better signal integrity may be obtained by individually configuring the ODT termination resistance of each flash memory die. In some implementations of the present disclosure, a target pad is configured to have a first termination resistance, and non-target pads are configured to have a second termination resistance. In other implementations of the present disclosure, a target pad is configured to have a first termination resistance, and non-target pads may be configured to have one of a plurality of termination resistances.

Figure 3B:
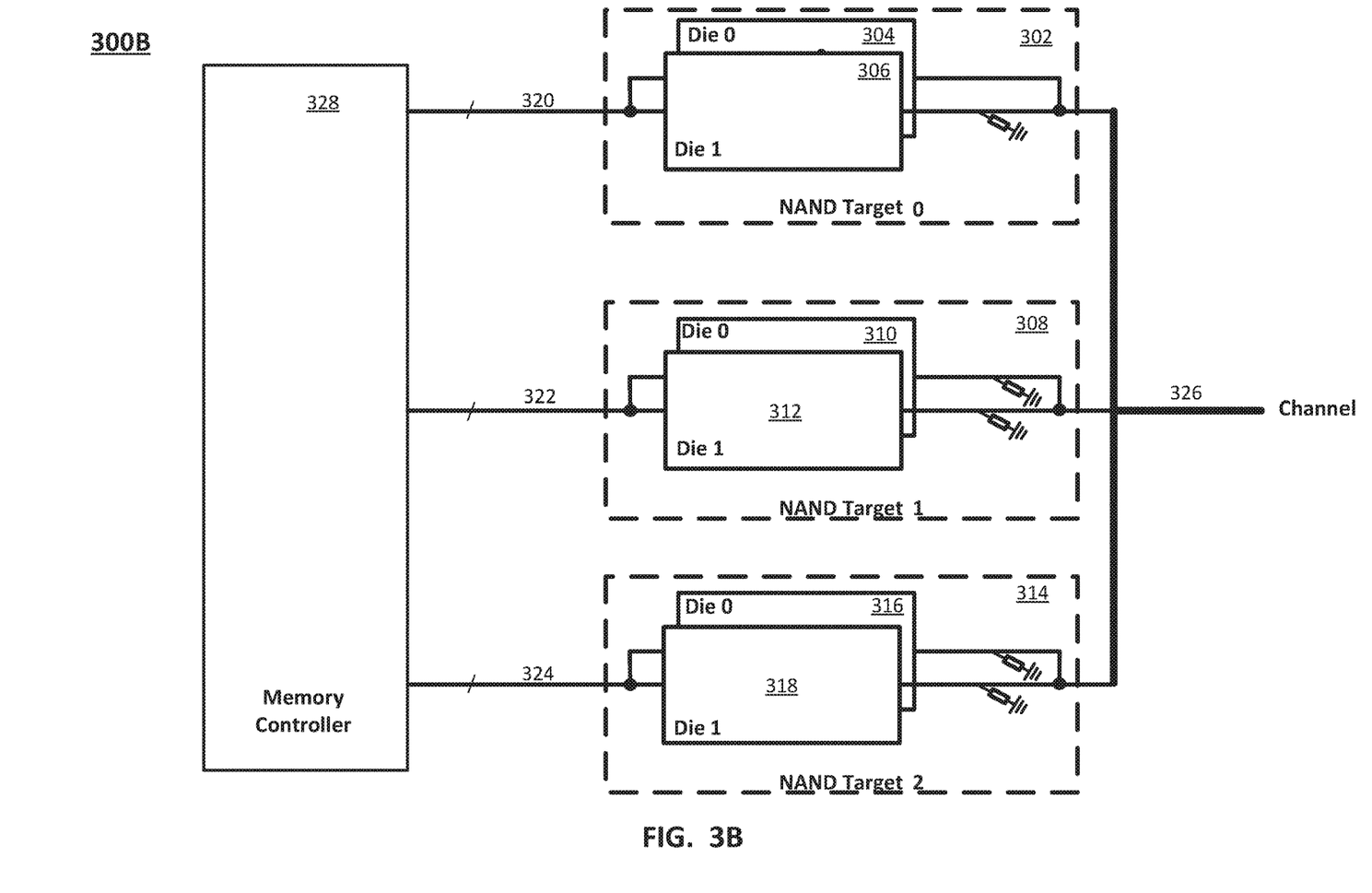
FIG. 3B is a high-level schematic diagram showing an arrangement of NAND flash memory dice having an ODT capability, and a NAND flash memory controller coupled to the NAND flash memory dice.

FIG. 3B is a high-level schematic diagram showing an arrangement of NAND flash memory dice having an ODT capability, and a NAND flash memory controller coupled to the NAND flash memory dice. FIG. 3B is very similar to FIG. 3A, but further includes a memory controller 328 coupled to the memory die 304, 306, 310, 312, 316, and 318. Those skilled in the art will recognize that although this illustrative implementation uses NAND flash memory and a NAND flash memory controller, alternative implementations that provide on-die termination in accordance with the present disclosure may be constructed with different types of memory technologies.

Figure 4:
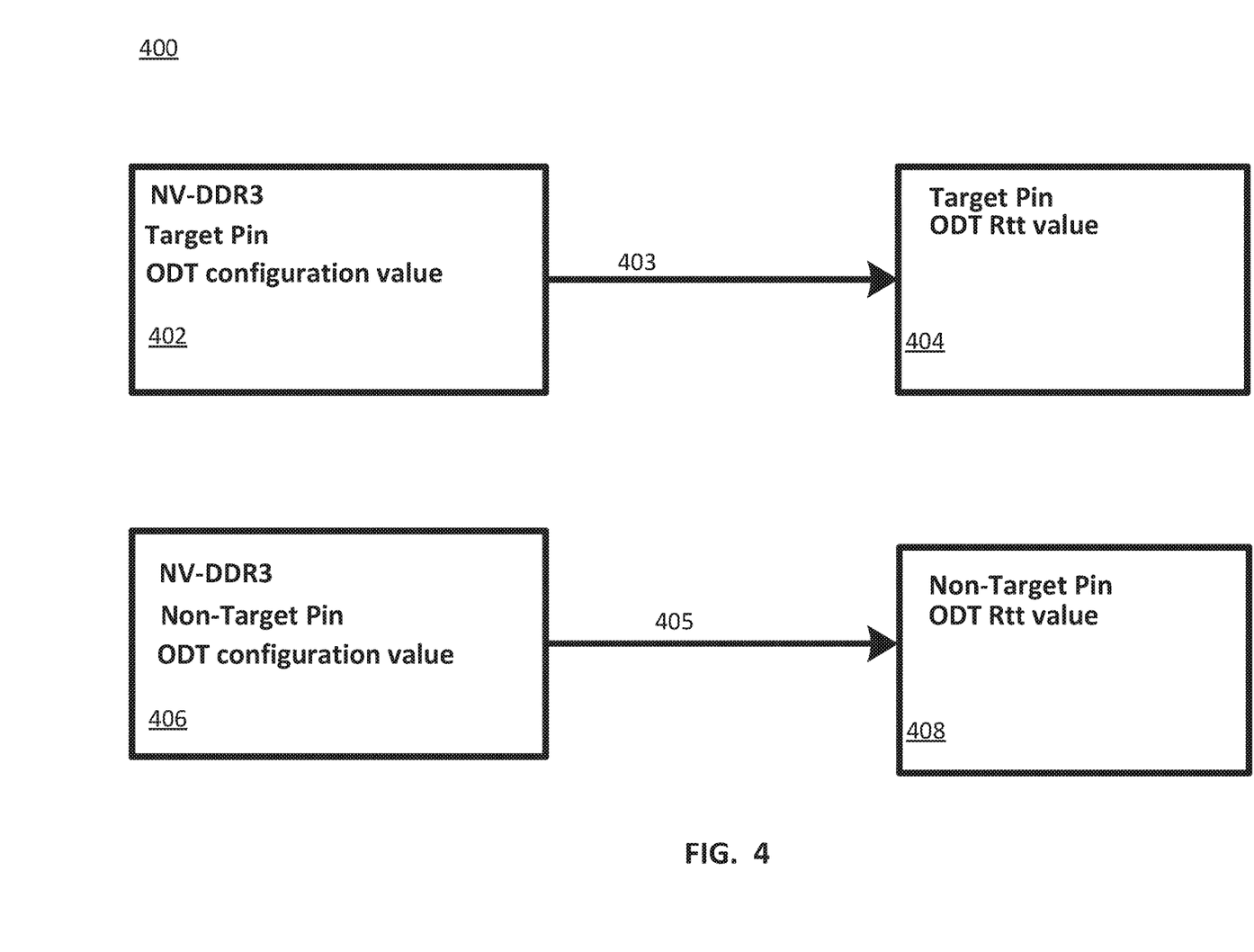
FIG. 4 is a block diagram illustrating the logical architecture 400 of an ODT arrangement similar to that shown in FIG. 2, except that different ODT configuration values are provided for targets as compared to non-targets.

FIG. 4 is a block diagram illustrating the logical architecture 400 of an ODT arrangement similar to that shown in FIG. 2, except that different ODT configuration values are provided for targets as compared to non-targets. FIG. 4 shows that instead of using the same ODT configuration value for both target and non-target pins (as indicated in FIG. 2), providing the ability to use a different ODT configuration value for target and non-target pins allows a greater flexibility, and a greater degree of control for setting the termination resistance. By enabling independent control of the termination resistance at each of the target and non-target pins, higher signal quality may be obtained, which in turn contributes to higher I/O performance.

Still referring to FIG. 4, logical architecture 400 includes a first logical block 402 that provides an ODT configuration value for a target pin. This ODT configuration value for a target pin is communicated by way of a first communication pathway 403 to first ODT Rtt circuit block 404. Logical architecture 400 further includes a second logical block 406 that provides an ODT configuration value for a non-target pin. This ODT configuration value for a non-target pin is communicated by way of a second communication pathway 405 to second ODT Rtt circuit block 408. In accordance with logical architecture 400, different ODT configuration values are provided, respectively, to target and non-target pins.

Figure 5:
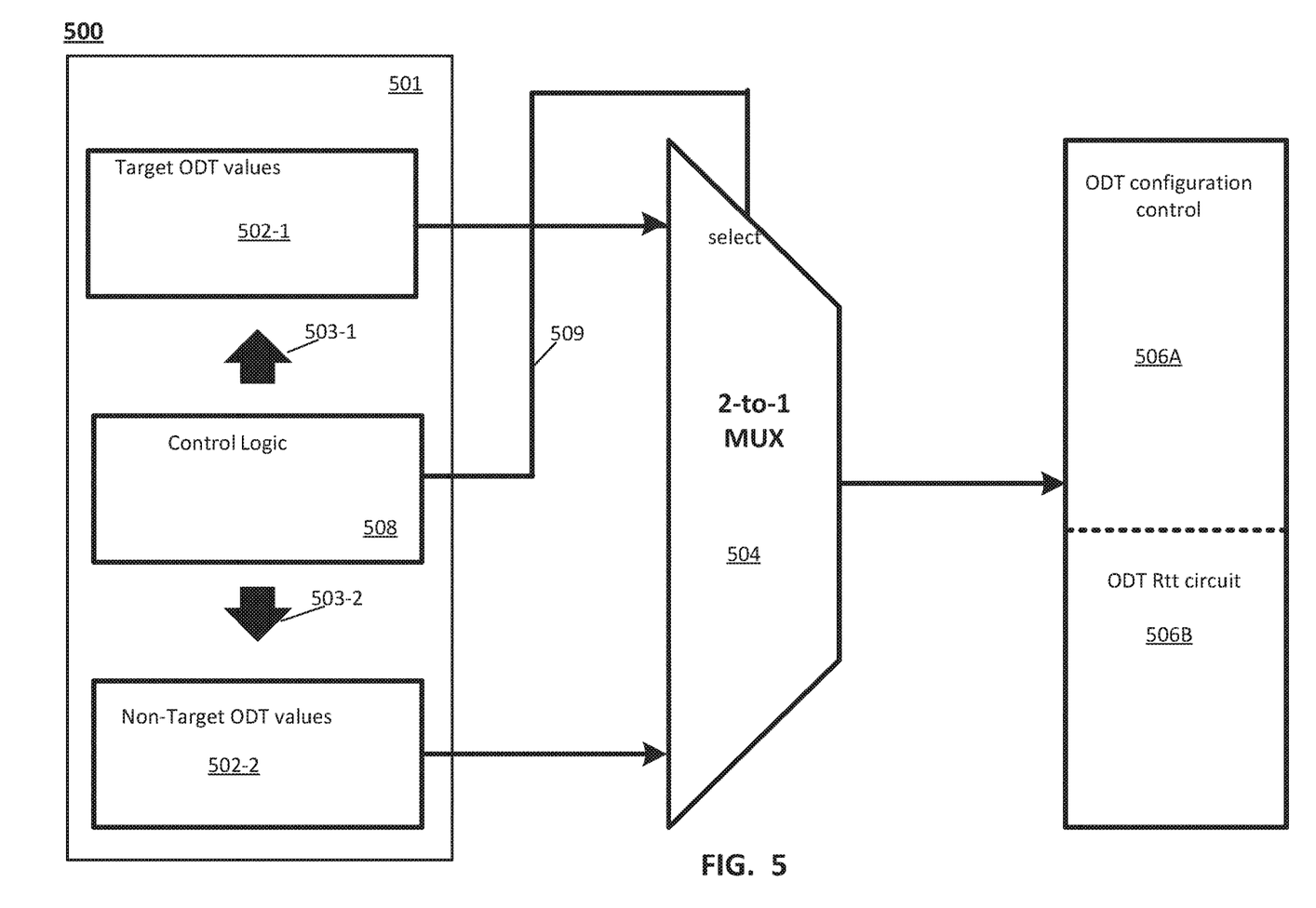
FIG. 5 is a high-level block diagram illustrating a logical architecture for selecting different ODT values based on whether a non-volatile memory die is a target or non-target for a memory operation.

FIG. 5 is a high-level block diagram illustrating a logical architecture 500 for selecting different ODT values based on whether a non-volatile memory die is a target or non-target for a memory operation. Logical architecture 500 provides for determining whether the non-volatile memory die is a target or non-target, and based at least in part on that determination, provides a corresponding ODT configuration value to a configuration control logic circuit. In turn, the configuration control logic circuit, which is coupled to an ODT Rtt circuit, configures the ODT Rtt circuit to provide an on-die termination resistance, the magnitude of which is based, at least in part on the ODT configuration value received by the configuration control logic circuit.

Still referring to FIG. 5, logical architecture 500 includes an ODT configuration value provider block 501. ODT configuration value provider block 501 may be configured to provide ODT configuration values 502-1, 502-2. In this example, ODT configuration values 502-1 and 502-2 represent, respectively, a first configuration value for use when the non-volatile memory die is a target in a memory operation, and a second configuration value for use when the non-volatile memory die is a non-target in a memory operation. In some implementations, a control logic block 508, which is part of ODT configuration value provider block 501, is coupled to provide control signals 503-1 and 503-2 for loading or setting, ODT configuration values 502-1 and 502-2 respectively.

Logical architecture 500 includes a mechanism for providing a selected one of ODT configuration values 502-1 and 502-2, to an ODT configuration control circuit 506A. In this example, the mechanism for providing the selected one of ODT configuration values 502-1 and 502-2, to ODT configuration control circuit 506A is 2-to-1 multiplexer 504. A control logic block 508 generates and provides a select control signal to 2-to-1 multiplexer 504. In this example, the select control signal is a digital signal that is communicated to 2-to-1 multiplexer 504 via pathway 509. As shown in FIG. 5, ODT configuration control circuit 506A is coupled to ODT Rtt circuit block 506B. ODT configuration control circuit 506A generates and provides control signals to ODT Rtt circuit block 506B, based on the selected ODT configuration value received from 2-to-1 multiplexer 504. ODT Rtt circuit block 506B, responsive to the control signals it receives from ODT configuration control circuit 506A, is configured to provide the desired termination resistance.

As noted above, FIG. 5 illustrates a logical architecture for configuring an ODT Rtt circuit block 506B. That is, there are many circuit options for implementing the various logical operations of logical architecture 500. For example, ODT configuration value provider block 501 may store ODT configuration values 502-1, 502-2, in a non-volatile memory such as, but not limited to, a flash memory, which may be factory programmed, or programmed by a flash memory controller during an initialization operation. Alternatively, ODT configuration values 502-1, 502-2, may be hardwired. In a further alternative, ODT configuration values 502-1, 502-2, may be stored in a volatile memory such as, but not limited to, an SRAM, a DRAM, or the bits of a register (either static or dynamic). Such volatile memories may be written during an initialization procedure, or similar update operation, to set the ODT configuration values. In a further example, the logical architecture of selecting 1 of 2 possible ODT configuration values 502-1, 502-2, is illustrated with 2-to-1 multiplexer 504. However, in implementations that use addressable memories (regardless of whether these addressable memories are volatile or non-volatile) to store ODT configuration values 502-1, 502-2, a multiplexer is not needed, and the output of control logic block 508 can be used as at least a portion of the memory address to access the stored ODT configuration values 502-1, 502-2.

Figure 6:
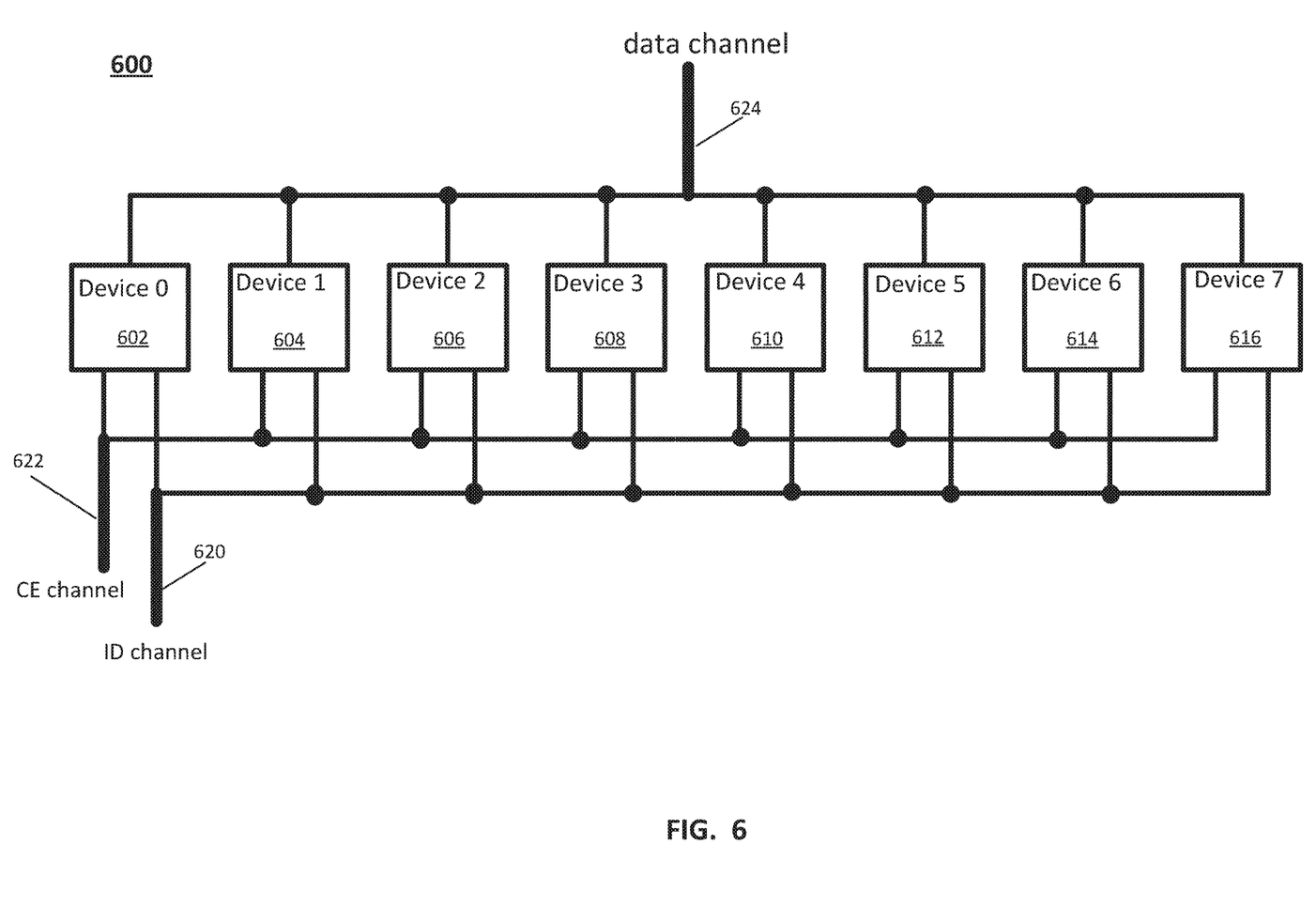
FIG. 6 is a high-level block diagram illustrating a plurality of non-volatile memory dice coupled to share a data channel, an ID channel, and a chip-enable channel.
Figure 7:
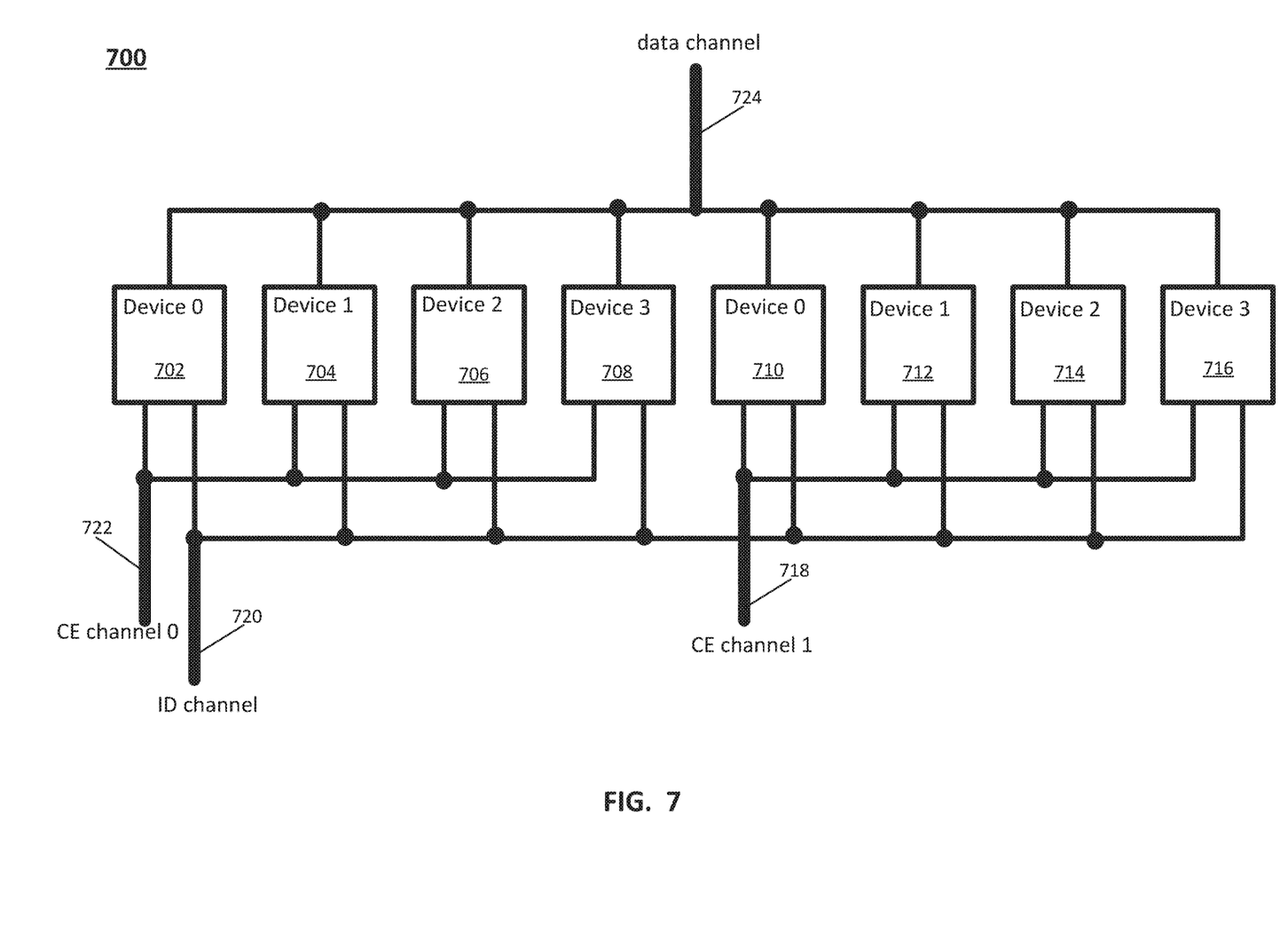
FIG. 7 is a block diagram illustrating a plurality of non-volatile memory dice coupled to share a data channel and an ID channel; and a first portion of the plurality of non-volatile memory dice share a first chip-enable channel, and a second portion of the plurality of non-volatile memory dice share a second chip-enable channel.

FIGS. 6 and 7 are similar in that they each illustrate non-volatile memory subsystems wherein the non-volatile memory dice are each coupled in common to a data channel, and each coupled in common to an ID channel. However, FIGS. 6 and 7, are different in that the arrangement of the chip-enable (CE) channel(s) is different from the implementations shown in FIGS. 6 and 7. As described in more detail below, the CE channel shown FIG. 6 is coupled to all of the non-volatile memory dice, whereas there are two separate CE channels (CE channel 0 and CE channel 1) shown in FIG. 7, with a first portion of the non-volatile memory dice coupled in common to CE channel 0, and a second portion of the non-volatile memory dice coupled in common to CE channel 1.

FIG. 6 is a high-level block diagram illustrating a non-volatile memory subsystem 600 including a plurality of non-volatile memory dice coupled to share a data channel, an ID channel, and a CE channel. Non-volatile memory subsystem 600 can benefit from implementations of the present disclosure in terms of improved signal integrity. In this illustrative implementation, non-volatile memory subsystem 600 includes a non-volatile memory device-0 602, a non-volatile memory device-1 604, a non-volatile memory device-2 606, a non-volatile memory device-3 608, a non-volatile memory device-4 610, a non-volatile memory device-5 612, a non-volatile memory device-6 614, and a non-volatile memory device-7 616. It will be appreciated that non-volatile memory devices 602 through 616 may be, but are not limited to, flash memory devices, NAND flash memory devices, three-dimensional (3D) NAND devices, or 3D phase-change material (PCM) memory devices.

Still referring to FIG. 6, each of non-volatile memory devices 602, 604, 606, 608, 610, 612, and 614, are coupled in common to an ID channel 620, a CE channel 622, and a data channel 624. Non-volatile memory devices 602, 604, 606, 608, 610, 612, and 614, may be, but are not limited to, planar flash memories, 3D flash memories, or 3D phase-change material (PCM) memories. In this illustrative implementation, all of non-volatile memory devices 602, 604, 606, 608, 610, 612, and 614, include ODT circuitry, and may therefore participate in providing termination for data channel 624 to which they are all connected in common. For example, if device-0 602, is a target for a memory operation and device-1 through device-7 are non-targets, then not only can targeted device-0 participate in providing termination resistance, but device-1 through device-7 may also participate in providing termination resistance. And, because the ODT configuration value for the non-target termination resistance may be set individually for each non-volatile memory die, the ODT performance of the non-target dice may be based, at least in part, on the relative position of the non-target die, the wire length to the data channel, and any other factor that would result in selecting a "better" ODT configuration value. The ODT behavior of non-volatile memory dice may be, but is not required to be, determined based, at least in part, on the ID channel and memory operation to be performed.

FIG. 7 is a block diagram illustrating another non-volatile memory subsystem 700 including a plurality of non-volatile memory dice coupled to share a data channel and an ID channel; and a first portion of the plurality of non-volatile memory dice share a first chip-enable channel, and a second portion of the plurality of non-volatile memory dice share a second chip-enable channel. Non-volatile memory subsystem 700 can benefit from implementations of the present disclosure. In this illustrative implementation, non-volatile memory subsystem 700 includes a non-volatile memory device-0 702, a non-volatile memory device-1 704, a non-volatile memory device-2 706, a non-volatile memory device-3 708, each of which is coupled in common to CE channel 0 722. Non-volatile memory subsystem 700 further includes a non-volatile memory device-0 710, a non-volatile memory device-1 712, a non-volatile memory device-2 714, and a non-volatile memory device-3 716, each of which is coupled in common to CE channel 1.

It will be appreciated that non-volatile memory devices 702 through 716 may be, but are not limited to, flash memory devices, NAND flash memory devices, three-dimensional (3D) NAND flash memory devices, or 3D phase-change material (PCM) memory devices.

Still referring to FIG. 7, each of non-volatile memory devices 702, 704, 706, 708, 710, 712, 714, and 716, are coupled in common to an ID channel 720, and a data channel 724. Further, each of non-volatile memory devices 702, 704, 706, 708 are coupled in common to a CE channel-0 722; and each of non-volatile memory devices 710, 712, 714, 716 are coupled in common to a CE channel-1 718. In some implementations, the ODT configuration values for non-volatile memory devices 702, 704, 706, 708, which are coupled to CE channel 0 may be different from the ODT configuration values of non-volatile memory devices 710, 712, 714, 716, which are coupled to CE channel 1.

Figure 8:
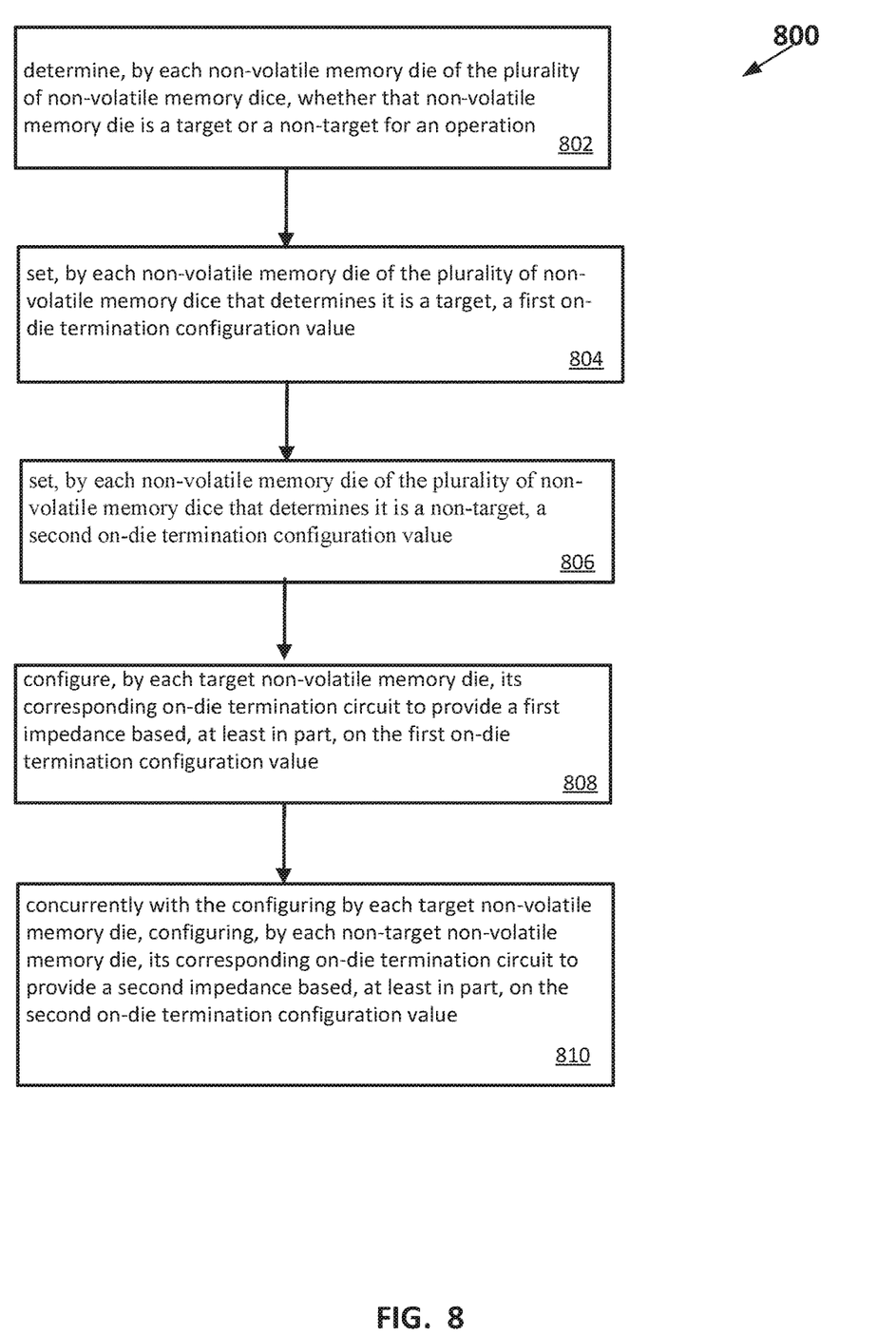
FIG. 8 is a flow diagram of an illustrative method in accordance with the present disclosure.

FIG. 8 is a flow diagram of an illustrative method 800 in accordance with the present disclosure. Illustrative method 800 configures an on-die termination circuit in each non-volatile memory die of a plurality of non-volatile memory dice in a non-volatile memory system, or subsystem, that has a plurality of non-volatile memory dice having one or more pads coupled in common with each other. In some implementations, the one or more pads coupled in common with each other are further coupled to a data channel. Method 800 includes determining 802, by each non-volatile memory die of the plurality of non-volatile memory dice, whether that non-volatile memory die is a target or a non-target for an operation, for example, a memory operation in which data may be transferred over the data channel. Method 800 also includes setting 804, by each non-volatile memory die of the plurality of non-volatile memory dice that determines it is a target, a first on-die termination configuration value, and setting 806, by each non-volatile memory die of the plurality of non-volatile memory dice that determines it is a non-target, a second on-die termination configuration value. In some implementations, rather than simply setting the second on-die termination configuration value for all the non-target non-volatile memory dice, each of the non-target non-volatile memory dice may set their on-die termination configuration value independently on the other non-target non-volatile memory dice. Method 800 further includes configuring 808, by each target non-volatile memory die, its corresponding on-die termination circuit to provide a first impedance based, at least in part, on the first on-die termination configuration value, and concurrently with the configuring by each target non-volatile memory die, configuring 810, by each non-target non-volatile memory die, its corresponding on-die termination circuit to provide a second impedance based, at least in part, on the second on-die termination configuration value. In some implementations, configuring the on-die termination circuit may be further based, at least in part, on junction temperature of the circuit, ambient temperature, power supply voltage, or other factors that may affect signal integrity on the data channel. In some implementations, one or more non-target on-die termination circuits may be disabled rather than configured to provide a particular input impedance.

Figure 9:
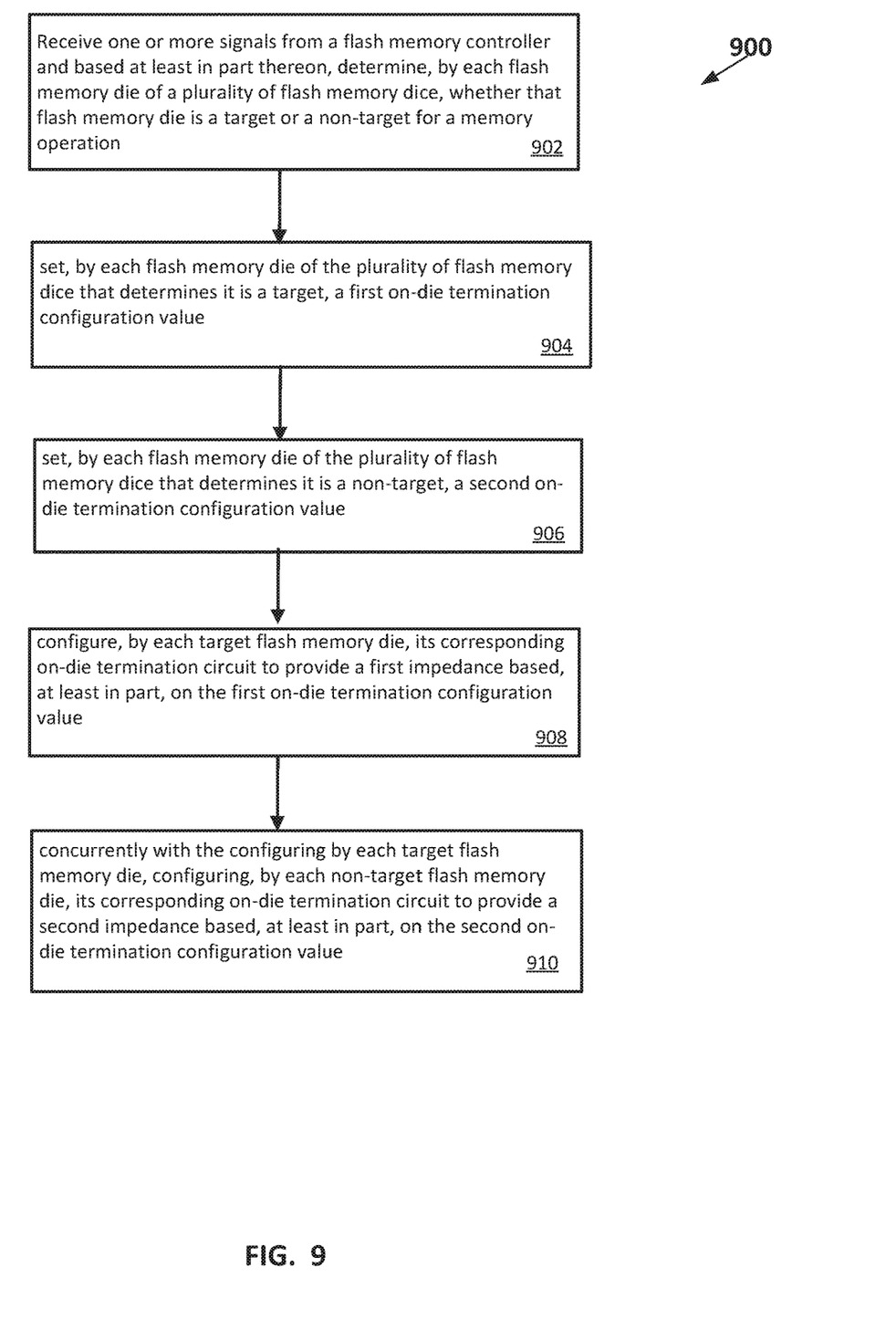
FIG. 9 is a flow diagram of another illustrative method in accordance with the present disclosure.

FIG. 9 is a flow diagram of an illustrative method 900 in accordance with the present disclosure. Illustrative method 900 is similar to method 800 but further includes receiving signals from a flash memory controller. Method 900 configures an on-die termination circuit in each flash memory die of a plurality of flash memory dice in a flash memory system, or subsystem, that has a plurality of flash memory dice having one or more pads coupled in common with each other. In some implementations, the one or more pads coupled in common with each other are further coupled to a data channel. Method 900 includes determining 902, by each flash memory die of the plurality of flash memory dice, whether that flash memory die is a target or a non-target for an operation, for example, a memory operation in which data may be transferred over the data channel. Method 900 also includes setting 904, by each flash memory die of the plurality of flash memory dice that determines it is a target, a first on-die termination configuration value, and setting 906, by each flash memory die of the plurality of flash memory dice that determines it is a non-target, a second on-die termination configuration value. In some implementations, rather than simply setting the second on-die termination configuration value for all the non-target flash memory dice, each of the non-target flash memory dice may set their on-die termination configuration value independently on the other non-target flash memory dice. Method 900 further includes configuring 908, by each target flash memory die, its corresponding on-die termination circuit to provide a first impedance based, at least in part, on the first on-die termination configuration value, and concurrently with the configuring by each target flash memory die, configuring 910, by each non-target flash memory die, its corresponding on-die termination circuit to provide a second impedance based, at least in part, on the second on-die termination configuration value. In some implementations, configuring the on-die termination circuit may be further based, at least in part, on junction temperature of the circuit, ambient temperature, power supply voltage, or other factors that may affect signal integrity on the data channel. In some implementations, one or more non-target on-die termination circuits may be disabled rather than configured to provide a particular input impedance.

In various implementations, the non-volatile memory dice may be, but are not limited to, NAND flash memories, 3D NAND flash memories, or 3D phase-change-memories, for example. Further, the mechanism by which these non-volatile memories store data may be, but is not limited to, floating gate, charge-trap, and phase-change. In these illustrative implementations, whether a non-volatile memory die is a target or non-target is determined by logical operations performed within that die. Various implementations may perform such logical operations by, for example, logic circuitry, or logic circuitry together with an embedded controller executing program code to perform at least a portion of the logical operations resulting in the determination of whether the aforementioned non-volatile memory die is a target or a non-target for a particular memory access operation.

In some implementations, determining by each non-volatile memory die of the plurality of non-volatile memory dice, whether that non-volatile memory die is a target or a non-target for an operation. Include receiving one or more signals from a non-volatile memory controller, such as but not limited to a flash memory controller.

In some implementations, the on-die termination configuration value may be a digital value, and the digital value directs on-die termination configuration circuitry to configure the on-die termination circuit to provide the termination resistance specified by the on-die termination configuration value.

In some implementations, the first memory area is a first register, and the second memory area is a second register.

In some implementations, the on-die termination circuit is configured provide a first termination impedance configuration responsive, at least in part, to the non-volatile memory device being a target, and the on-die termination circuit is configured provide a second termination impedance configuration responsive, at least in part, to the non-volatile memory device being a non-target, and the first termination impedance configuration and the second termination impedance configuration are different from each other.

The foregoing description of the specific implementations will so reveal the general nature of the present disclosure that others can, by applying knowledge within the skill of the art, readily modify and/or adapt for various applications such specific implementations, without undue experimentation, and without departing from the general concept of the present disclosure. Therefore, such adaptations and modifications are intended to be within the meaning and range of equivalents of the disclosed implementations, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Implementations of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary implementations of the present disclosure as contemplated by the inventor(s), and thus, are not intended to limit the present disclosure and the subjoined claims in any way.

Various functional blocks, modules, and steps are disclosed above. The particular arrangements provided are illustrative and without limitation. Accordingly, the functional blocks, modules, and steps may be re-ordered or combined in different ways than in the examples provided above. Likewise, certain implementations include only a subset of the functional blocks, modules, and steps, and any such subset is permitted.

The breadth and scope of the present disclosure should not be limited by any of the above-described illustrative implementations, but should be defined only in accordance with the subjoined claims and their equivalents.

What is claimed is:

1. A method of configuring an on-die termination circuit comprising:
    determining, by each memory die of a plurality of memory dice, whether that memory die is a target or a non-target for an operation;
    setting, by each memory die of the plurality of memory dice that determines it is a target, a first on-die termination configuration value;
    setting, by each memory die of the plurality of memory dice that determines it is a nontarget, a corresponding on-die termination configuration value selected from a plurality of non-target on-die configuration values, wherein each memory has the plurality of non-target on-die configuration values stored therein;
    configuring, by each target memory die, its corresponding on-die termination circuit to provide a first impedance based, at least in part, on the first on-die termination configuration value; and
    concurrently with the configuring by each target memory die, configuring, by each nontarget memory die, its corresponding on-die termination circuit to provide an impedance based, at least in part, on the corresponding on-die termination configuration value selected from the plurality of non-target on-die configuration values.

2. The method of claim 1, wherein the plurality of memory dice are non-volatile memory dice, and determining comprises receiving one or more signals from a non-volatile memory controller.

3. The method of claim 1, wherein the plurality of memory dice comprise flash memory dice.

4. The method of claim 1, wherein the plurality of memory dice comprise phase-change memory dice.

5. The method of claim 1, wherein the plurality of memory dice comprise dice having both flash memory cells and phase-change memory cells thereon.

6. The method of claim 3, wherein the first impedance is compatible with a non-volatile double date rate 3 (NV-DDR3) specification.

7. The method of claim 1, wherein the first impedance and an impedance of at least one non-target memory die are different.

8. A memory device, comprising:
    a plurality of storage locations containing a corresponding plurality of on-die termination configuration values, wherein the plurality of corresponding on-die termination configuration values include at least one target value and two or more non-target values; and
    an on-die termination circuit configured to provide one of a plurality of termination impedances responsive to a selected one of the plurality of on-die termination configuration values,
    wherein the selected one of the on-die termination configuration values is selected based, at least in part, on whether the memory device is one of a target and a non-target.

9. The memory device of claim 8, wherein the on-die termination circuit is configured to provide a first termination impedance configuration responsive, at least in part, to the memory device being a target, and the on-die termination circuit is configured to provide a second termination impedance configuration responsive, at least in part, to the memory device being a non-target; and
    wherein the first termination impedance configuration and the second termination impedance configuration are different from each other.

10. The memory device of claim 9, wherein the memory device comprises a flash memory device.

11. The memory device of claim 9, wherein the memory device comprises a phase-change memory device.

12. A system, comprising:
    a first non-volatile memory die having a first input/output (I/O) pad coupled to a first on-die termination (ODT) circuit disposed on the first non-volatile memory die, and further having a first plurality of non-volatile storage locations containing a corresponding first plurality of on-die termination configuration values, wherein the first plurality of on-die termination configuration values include at least one target value and two or more non-target values;

a second non-volatile memory die having a second I/O pad coupled to a second ODT circuit disposed on the second non-volatile memory die, and further having a second plurality of non-volatile storage locations containing a corresponding second plurality of on-die termination configuration values, wherein the second plurality of on-die termination configuration values include at least one target value and two or more non-target values, wherein the first I/O pad and the second I/O pad are coupled to each other;

a non-volatile memory controller die having a third I/O pad, the third I/O pad coupled to the first I/O pad and the second I/O pad;

a first ODT configuration circuit disposed on the first non-volatile memory die, the first ODT configuration circuit configured to set the first ODT circuit to provide a first impedance value responsive to the first I/O pad being a target of an operation, and to set the first ODT circuit to provide a second impedance value responsive to the first I/O pad being a non-target of the operation, the second impedance value based on an on-die termination configuration value selected from the first plurality of on-die termination configuration values; and a second ODT configuration circuit disposed on the second non-volatile memory die, the second ODT configuration circuit configured to set the second ODT circuit to provide the first impedance value responsive to the second I/O pad being the target of the operation, and to set the second ODT circuit to a third impedance value responsive to the second I/O pad being a non-target of the operation, the third impedance value based on an on-die termination configuration value selected from the second plurality of on-die termination configuration values.

13. The system of claim 12, wherein the first impedance value and the second impedance value are different from each other.

14. The system of claim 12, wherein the first non-volatile memory die and the second non-volatile memory die each comprise a flash memory.

15. The system of claim 12, wherein the first non-volatile memory die and the second non-volatile memory die each comprise a phase-change memory.

16. The method of claim 1, wherein configuring, by each target memory die, its corresponding on-die termination circuit to provide the first impedance is further based, at least in part, on one or more of junction temperature, ambient temperature, and power supply voltage.

17. The device of claim 9, wherein at least one of the plurality of storage locations comprises a non-volatile storage location, and the memory device further includes a chip-enable pad.

18. The device of claim 9, wherein at least one of the plurality of storage locations comprises a register, and the memory device further includes a chip-enable pad.

19. The system of claim 12, wherein the first non-volatile memory die further includes a first chip-enable pad, and the second non-volatile memory die further includes a second chip-enable pad.

20. The system of claim 19, wherein the first chip-enable pad and the second chip-enable pad are coupled to each other.

* * * * *